(12) United States Patent
Pan et al.

(10) Patent No.: US 7,482,253 B2
(45) Date of Patent: Jan. 27, 2009

(54) FUSING NANOWIRES USING IN SITU CRYSTAL GROWTH

(75) Inventors: Alfred Pan, Sunnyvale, CA (US);
Yoocharn Jeon, Palo Alto, CA (US);
Hou T. Ng, Mountain View, CA (US);
Scott Haubrich, Albuquerque, NM (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/689,487

(22) Filed: Mar. 21, 2007

(65) Prior Publication Data

US 2007/0202620 A1 Aug. 30, 2007

Related U.S. Application Data

(62) Division of application No. 11/077,830, filed on Mar. 11, 2005, now Pat. No. 7,218,004.

(51) Int. Cl.
*H01L 23/58* (2006.01)
(52) U.S. Cl. .................. 438/487; 438/486; 257/772
(58) Field of Classification Search .......... 438/487, 438/614, 618, 486; 257/772, 774, 781
See application file for complete search history.

(56) References Cited

U.S. PATENT DOCUMENTS 5,376,386 A * 12/1994 Ganderton et al. .......... 424/499
6,538,801 B2   3/2003 Jacobson et al.
6,720,240 B2   4/2004 Gole et al.
7,147,894 B2 * 12/2006 Zhou et al. ................. 427/256
2003/0172867 A1 * 9/2003 Shinnar et al. ............... 117/68
2006/0245998 A1 * 11/2006 Kahn et al. ............... 423/592.1

OTHER PUBLICATIONS

Thomas P. Nielsen, et al., "Review: Deposition of Ceramis Thin Films at Low Temperatures from Aqueous Solutions", J. Electroceramics, 6, 2001, pp. 169-207.
Lincoln J. Lauhon, et al., "Epitaxial Core-shell and Core-Multishell Nanowire Heterostructures", Letter to Nature, Nature, vol. 420, Nov. 7, 2002, pp. 57-61.
Scott Wood, "Precipitation and Dissolution", http://www.sci.uidaho.edu/geol478_578/PDF/Lectures/GEOL578-Lecture4.PDF, pp. 1-54.

* cited by examiner

*Primary Examiner*—Phuc T Dang

(57) ABSTRACT

Crystal growth performed in situ facilitates interconnection of prefabricated nano-structures. The nano-structures are immersed in a growth solution having a controllable saturation condition. Changing the saturation condition of the solution modifies a size of the immersed nanowires. The solution includes a solute of a nano-structure precursor material. The saturation condition is changed to one or both etch material from a surface of the nano-structures and initiate crystal growth on the nano-structure surface. A nano-structure interconnection system includes the growth solution and equipment to deposit the prefabricated nano-structures on a substrate. An interconnected structure includes a plurality of nano-structures disposed on a substrate in a cluster and a liquid phase-grown crystal lattice on surfaces of the nano-structures to form physical interconnections between the plurality. An ink formulation includes the plurality of nano-structures suspended in the growth solution.

46 Claims, 7 Drawing Sheets

─ 100

110 ─ Deposit Nanowires on Substrate

120 ─ Perform In Situ Crystal Growth

FUSING NANOWIRES USING IN SITU CRYSTAL GROWTH

CROSS-REFERENCE TO RELATED APPLICATIONS

This is a Divisional Application of U.S. patent application Ser. No. 11/077,830, filed Mar. 11, 2005, which issued as U.S. Pat. No. 7,218,004, on May 15, 2007, the entire disclosure if which is incorporated herein by reference.

BACKGROUND

1. Technical Field

The invention relates to nanotechnology. In particular, the invention relates to structures having nano-scale feature sizes fabricated using nano-structures.

2. Description of Related Art

Nanotechnology is concerned with the fabrication and application of so-called nano-scale, crystalline structures, structures having at least one linear dimension between 1 nm and 200 nm. These nano-scale crystalline structures are often 50 to 100 times smaller than conventional semiconductor structures. Hereinafter, a nano-scale, crystalline structure may be referred to as a 'nano-structure' that includes, but is not limited to, a nanoparticle and a nanowire. Nanoparticles and nanowires are individual, low dimensional, nano-scale, crystalline structures. Specifically, nanoparticles are generally characterized as having three quantum confined dimensions or directions (i.e., width, height, and length) while nanowires typically are characterized as having two quantum confined dimensions or directions (i.e., width and height) along with one unconfined dimension or direction (i.e., length). The presence of the unconfined dimension in nanowires facilitates electrical conduction along that dimension. As such, nanowires may be used in applications requiring true electrical conduction instead of other forms of electron transport such as tunneling. Moreover, the confined and/or unconfined directions provide a specific density of electronic states that may impart significantly different electrical, optical and magnetic properties to nanoparticles and nanowires as well as structures composed thereof when compared to structures comprising more conventional bulk crystalline materials. As such, nanoparticles and nanowires, especially semiconductor nanoparticles and nanowires, offer intriguing possibilities for use in structures comprising aggregated numbers of such nanoparticles or nanowires.

Nano-structures, such as nanoparticles and nanowires may be fabricated by a number of different techniques. For example, nano-structures may be simultaneously fabricated in relatively large quantities and then 'harvested' or otherwise collected together as detached or free nano-structures. These free nano-structures may be deposited on a substrate or surface to provide more complex structures composed of many of the nano-structures. For example, nanowires may be deposited on the substrate in a narrow linear cluster made up of a large number of nanowires. Such nanostructure-based, linear clusters may be employed to interconnect circuit elements or components in an integrated circuit, for example, such as a circuit trace or a wire-like interconnect. Alternatively, a large number of nanowires may be deposited on a substrate in a broad planar cluster to form a film or sheet of nanowires (e.g., a nano-layer film). Such nanostructure-based films may be patterned or otherwise modified to become a portion of a circuit element or component (e.g., a gate conductor of a field effect transistor) and/or a portion of a circuit interconnect. Similarly, nanoparticles or combinations of nanowires and nanoparticles may be employed as deposited clusters or aggregations.

Unfortunately, individual nanowires and nanoparticles deposited on a substrate as either a linear, wire-like form or a planar film often exhibit a relatively high aggregate resistivity as a deposited structure. In particular, the aggregate resistivity is often independent of a resistivity of the individual nanostructures that make up the deposited cluster. The high aggregate resistivity is generally due to a relatively small average physical contact area between the individual crystalline nanostructures of the cluster formed during deposition. For example, if a nanowire is assumed to have an essentially cylindrical shape, the physical contact or connectivity between adjacent nanowires, whether the nanowires are deposited with a generally oriented distribution or a generally random or unoriented distribution, is essentially confined to point contacts along a circumference of the nanowires. Such point contacts make for poor electrical as well as mechanical interfaces between deposited nanowires leading to an unexpectedly high aggregate resistance.

Accordingly, it would be desirable to have an approach to create and/or improve connectivity between clusters of nanostructures. Such an approach would solve a long-standing need in the area of nanotechnology and in the use of nanostructures, such as nanowires and nanoparticles.

BRIEF SUMMARY

In some embodiments of the present invention, a method of interconnecting nano-structures is provided. The method of interconnecting comprises performing crystal growth in situ on prefabricated nano-structures immersed in a growth solution having a controllable saturation condition, such that interconnection between the nano-structures is facilitated.

In other embodiments of the present invention, a method of modifying a size of a preformed nano-structure using crystal growth is provided. The method of modifying comprises immersing preformed nano-structures in a solution comprising a solute of a nano-structure precursor material. The method further comprises changing a saturation of the solute to one or both of etch material from a surface of the preformed nano-structure and initiate crystal growth on a surface of the preformed nano-structure, such that the size of the preformed nano-structure is modified.

In other embodiments of the present invention, a nano-structure interconnection system is provided. The nano-structure interconnection system comprises deposition equipment that deposits nano-structures on a surface of a substrate in a cluster. The nano-structure interconnection system further comprises a solution having a controllable saturation condition in which the nano-structures are immersed. The solution comprises a crystal material dissolved in a solvent. The saturation condition is controlled to grow the crystal material on a surface of the immersed nano-structures to fuse together the nano-structures of the cluster on the substrate.

In other embodiments of the present invention, an interconnected structure is provided. The interconnected structure comprises a plurality of nano-structures, which are disposed on a surface of a substrate in a cluster. The interconnected structure further comprises a liquid phase-grown crystal lattice on surfaces of the nano-structures. The grown crystal lattice bridges between adjacent nano-structures to form physical interconnections between the plurality of nano-structures. During liquid phase growth, the nano-structures are immersed in a growth solution with a controllable saturation condition.

In other embodiments of the present invention, an ink formulation for an inkjet printer is provided. The ink formulation comprises a plurality of nano-structures and a growth solution. The growth solution comprises a crystal material dissolved in a solvent. The crystal material has a characteristic in common with a material of the nano-structures. The plurality of nano-structures is suspended in the growth solution. The growth solution is manipulatable to facilitate fusing of the plurality of nano-structures on a substrate that uses the crystal material of the solution.

Certain embodiments of the present invention have other features in addition to and in lieu of the features described hereinabove. These and other features of the invention are detailed below with reference to the following drawings.

BRIEF DESCRIPTION OF THE DRAWINGS

The various features of embodiments of the present invention may be more readily understood with reference to the following detailed description taken in conjunction with the accompanying drawings, where like reference numerals designate like structural elements, and in which.

DETAILED DESCRIPTION

Figure 1:
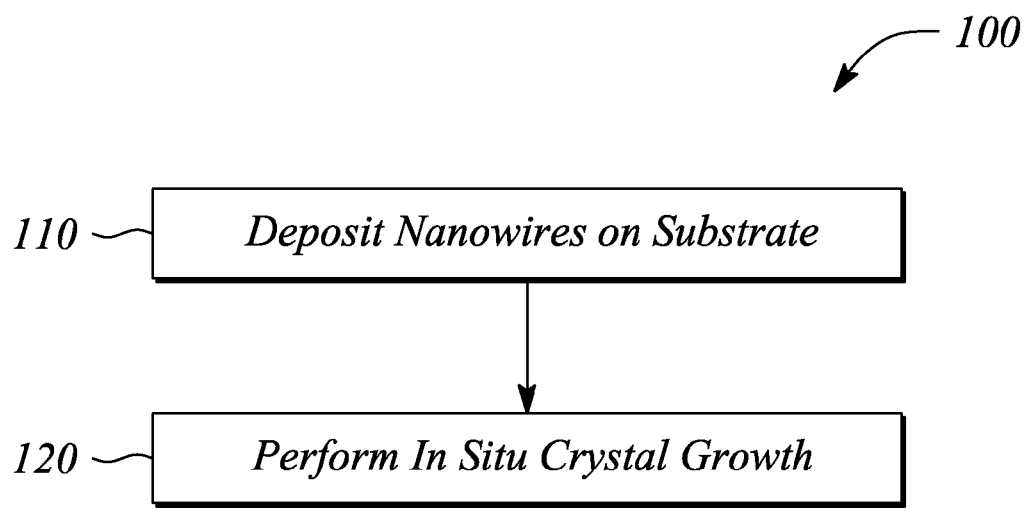
FIG. 1 illustrates a flow chart of a method of interconnecting nanowires according to an embodiment of the present invention.

The embodiments of the present invention facilitate interconnecting nano-structures including, but not limited to, nanowires, nanoparticles and combinations thereof. Hereinafter, the term 'nanowires' or 'nano-structures' will be used to generally refer to one or both of nanowires and nanoparticles, without limitation. Moreover, examples and embodiments described herein may refer to 'nanowires' and are intended to apply equally to nano-structures including, but not limited to, nanoparticles and combinations of nanowires and nanoparticles. In some embodiments, interconnections between nanowires deposited on a substrate as a cluster or aggregated structure are formed where an interconnection was not previously present. In some embodiments, interconnections between nanowires deposited on a substrate as a cluster or aggregated structure are strengthened and/or improved when pre-existing interconnections are present. By 'strengthened' and/or 'improved', it is meant that at least one or both of a physical or mechanical/structural contact between nanowires is increased and an electrical resistance of the interconnection is reduced relative to the pre-existing interconnection. The embodiments of the present invention essentially provide means for adding material to prefabricated deposited nanowires. The added material expands a size of the deposited nanowires to one or more of form, strengthen and improve interconnections between the deposited nanowires of the cluster, depending on the embodiment. These facilitated interconnections may include, but are not limited to, an electrical interconnection, an optical interconnection, and a mechanical/structural interconnection. The material added may be one or more of an amorphous material, a poly-crystalline material and a single- or mono-crystalline material. Such an interconnected cluster or aggregated structure, according to the various embodiments of the present invention, may be referred to herein as an 'interconnected structure' or an 'interconnected formation'.

In some embodiments of the present invention, an amount of an interface at the nanowire interconnections is controlled. Moreover, interconnected structures may be produced with a minimal interface-related defect density, according to some embodiments. Such interconnections are achieved without heating the deposited nanowire to a near melting point of the nanowire, according to some embodiments.

In some embodiments, crystal growth and/or crystal regrowth is employed to add the material to the deposited nanowires according to the present invention. In some embodiments, the material added to a nanowire comprises a crystal lattice essentially similar to a crystal lattice of the nanowire. In some of these embodiments, the crystal lattice added to the crystal lattice of the nanowire effectively extends or continues the nanowire crystal lattice. In other embodiments, the added material is a crystal lattice having a structure and/or material composition that differs from that of the nanowire.

As used herein, 'crystal regrowth' generally refers to crystal growth that occurs on or in association with a lattice of an existing crystal after removal of some of the crystal from the lattice. Typically, regrowth is confined to a region of the lattice associated with an exposed surface of the crystal lattice. For example, extending or adding to the lattice after a portion of the crystal lattice is liquefied, dissolved, or re-dissolved is crystal regrowth. In some instances, regrowth may yield an improved or 'better' crystalline structure by removing less stable, defect-laden or otherwise 'not-so-flawed', crystalline material and replacing the removed material with more stable crystalline material having fewer lattice defects.

As such, 'crystal growth and/or crystal regrowth' means one or both of crystal growth in a primary sense (e.g., without prior removal of some of the existing crystal) and crystal regrowth, as defined above. Hereinbelow, the term 'crystal growth' will be used interchangeably for 'crystal growth', 'crystal regrowth', and 'crystal growth and/or crystal regrowth' except where specific use of the terms is necessary for proper understanding.

According to the various embodiments of the present invention, the prefabricated nanowires are immersed in a solution comprising the material to be added. In particular, the solution comprises the material to be added (i.e., a solute) dissolved in a solvent. The material solute is or acts as a precursor from which the added material precipitates onto the nanowire. In some embodiments, the added material is a crystal lattice that is grown and/or regrown on the nanowire.

In general, crystal growth occurs when the precursor solute is in a saturated or supersaturated state or condition in the solution. Herein, the term 'supersaturated' is employed to describe a saturation condition of a solute that is neither unsaturated nor at equilibrium (i.e., the solute concentration is generally above a saturation limit). Crystal growth generally will occur slowly, if at all, when the precursor solute is in an unsaturated condition in the solution. In some embodiments, when the solute is in the unsaturated condition, the solution may even dissolve portions of an existing crystal lattice. As such, when the prefabricated nanowires are exposed to the solution, a saturation condition of the solution (i.e., whether the precursor solute is unsaturated or supersaturated in the solution) essentially determines whether the crystalline material is removed from the nanowire or some of the crystalline structure of the nanowire is added to the nanowire, respectively.

According to the various embodiments of the present invention, the saturation condition of the precursor solute in the solution (i.e., either unsaturation or supersaturation) is controllable. As used herein, 'the saturation condition of the precursor solute in the solution' may be referred to herein as the 'saturation condition of the solution' or the 'saturation condition' for simplicity. The saturation condition is controllable by controlling the solubility of the solute in the solution. Parameters that affect solubility are known and include, but are not limited to, solute concentration, solution pH, and solution temperature. In addition, the intrinsic molecular nature of the solvent/solute system, the polarity of the solvent (i.e., solvent strength), and the density may also influence solubility and thereby influence the saturation condition of the solution. Moreover, as used herein, a 'super-critical' limit of the solution is a boundary separating specific solution parameters that produce either an unsaturated condition or a supersaturated condition.

For example, a pH super-critical limit of the solution defines a boundary of the solution pH that divides the solute unsaturation condition from the solute supersaturation condition. Generally, the exemplary pH boundary is also a function of other solution characteristics such as, but not limited to, a solute concentration and a solution temperature. As such, the exemplary pH boundary is often represented graphically in two dimensions (i.e., two characteristics such as solution pH and solute concentration) as a curve, or in three dimensions as a surface.

The saturation condition of the solution is controlled by manipulating or changing one or more of the characteristics of the solution such that the super-critical limit is crossed. For example, the pH of the solution may be manipulated to change the saturation condition of the solution from unsaturated to supersaturated, or vice versa, such that the pH super-critical limit is crossed. In another example, a concentration of the solute and/or a temperature of the solution are/is changed to control the saturation condition of the solution. Essentially any characteristic of the solution related to the solution saturation condition may be changed or adjusted to effect saturation condition control according to various embodiments of the present invention. Such control of the saturation condition through manipulation of solution characteristics associated with the super-critical limit of the solution facilitates control of crystal growth, according to the various embodiments.

In some embodiments, a saturation modifying material is added to the growth solution to induce the saturation condition change. The saturation modifying material includes, but is not limited to, an acid, a base and a buffer that may be added to the solution to manipulate or change the pH of the solution, for example. In another example, the saturation modifying material includes, but is not limited to, a chelating material that may be added to the solution to bind and/or precipitate the solute to change the concentration of the solution. In yet another example, the concentration of the solution may be changed by adding solvent to the solution, wherein the added solvent is the saturation modifying material. One skilled in the art may readily identify other saturation modifying materials that may be used, all of which are within the scope of the embodiments of the present invention.

The controllable saturation condition of the solution enables control of an initiation of crystal growth on the nanowire. In some embodiments, the controllable saturation condition further enables reversible crystal growth (e.g., crystal regrowth). Specifically, in reversible crystal growth, material may be controllably removed (e.g., dissolved) from the nanowires as well as added to or regrown on the nanowires during nanowire interconnection. In some embodiments, crystal defects associated with crystal lattice grain boundaries between crystal lattices on adjacent nanowires may be reduced when interconnecting using such reversible crystal growth. Moreover, in some embodiments, nanowires are interconnected at relatively low temperatures when compared to other interconnection methods such as using a sintering process.

FIG. 1 illustrates a flow chart of a method 100 of interconnecting nanowires according to an embodiment of the present invention. The method 100 generally applies to interconnecting prefabricated or preformed nanowires. As used herein, 'prefabricated nanowires' refers to nanowires fabricated or formed using essentially any method of producing nanowires prior to applying the method 100. For example, prefabricated single crystal nanowires may be grown using methods such as, but not limited to, vapor-liquid-solid (VLS), solution-liquid-solid (SLS), and non-catalytic vapor-phase epitaxy. Other methods for producing prefabricated nanowires include, but are not limited to, template-assisted synthesis, nanoimprint lithography, dip-pen nanolithography, self-assembly of nanoparticles, solution phase methods based on capping reagents, and solvothermal methods. For example, fabrication of silicon (Si) nanowires is described by Gole et al., in U.S. Pat. No. 6,720,240, incorporated herein by reference.

The method 100 of interconnecting nanowires comprises depositing 110 prefabricated nanowires on a substrate. For example, the nanowires may be deposited 110 to form either a linear or wire-like structure (e.g., circuit trace) or a planar film that coats or covers the substrate or a portion thereof. Nanowires within either the linear structure or the planar film may be deposited 110 such that the deposited nanowires have either an oriented or an unoriented (e.g., random) distribution.

Figure 2A:
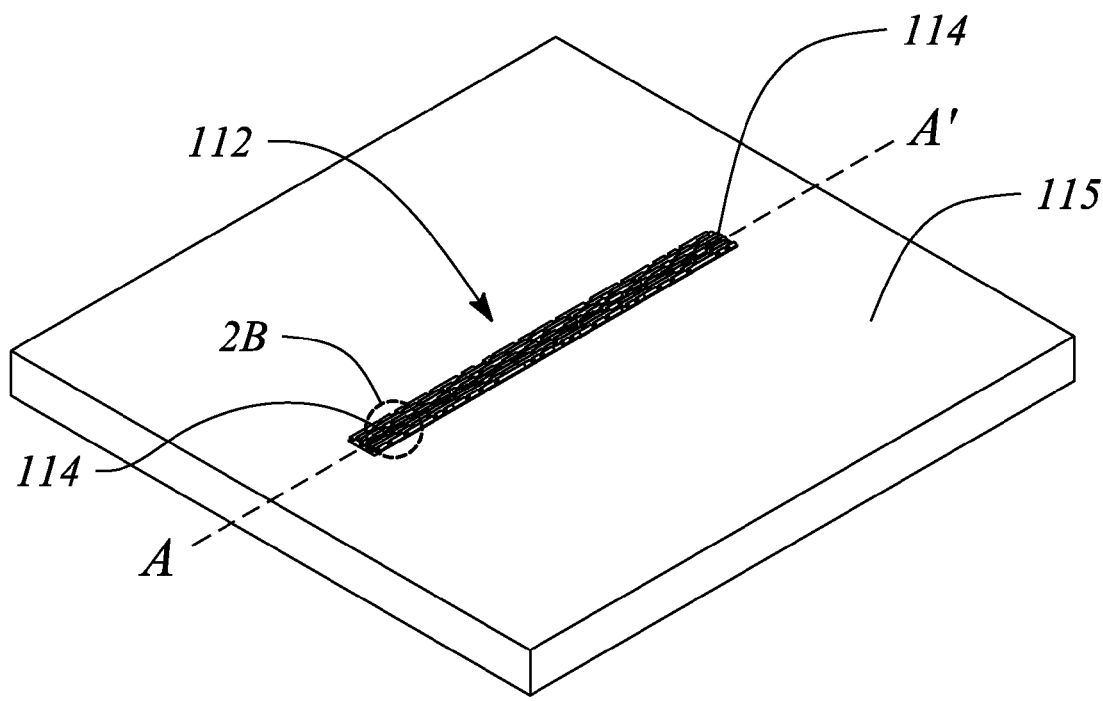
FIG. 2A illustrates a perspective view of a portion of a linear or wire-like structure formed by nanowires deposited on a substrate according to an embodiment of the present invention.

FIG. 2A illustrates a perspective view of a portion of a linear or wire-like structure 112 formed by nanowires 114 deposited 110 on a substrate 115 according to an embodiment of the present invention. The linear structure 112 may be straight, as shown, or have one or more of curves, bends, branches and angles along its length (not illustrated). Additionally, the linear structure 112 may have a width that varies along its length (not illustrated).

Figure 2B:
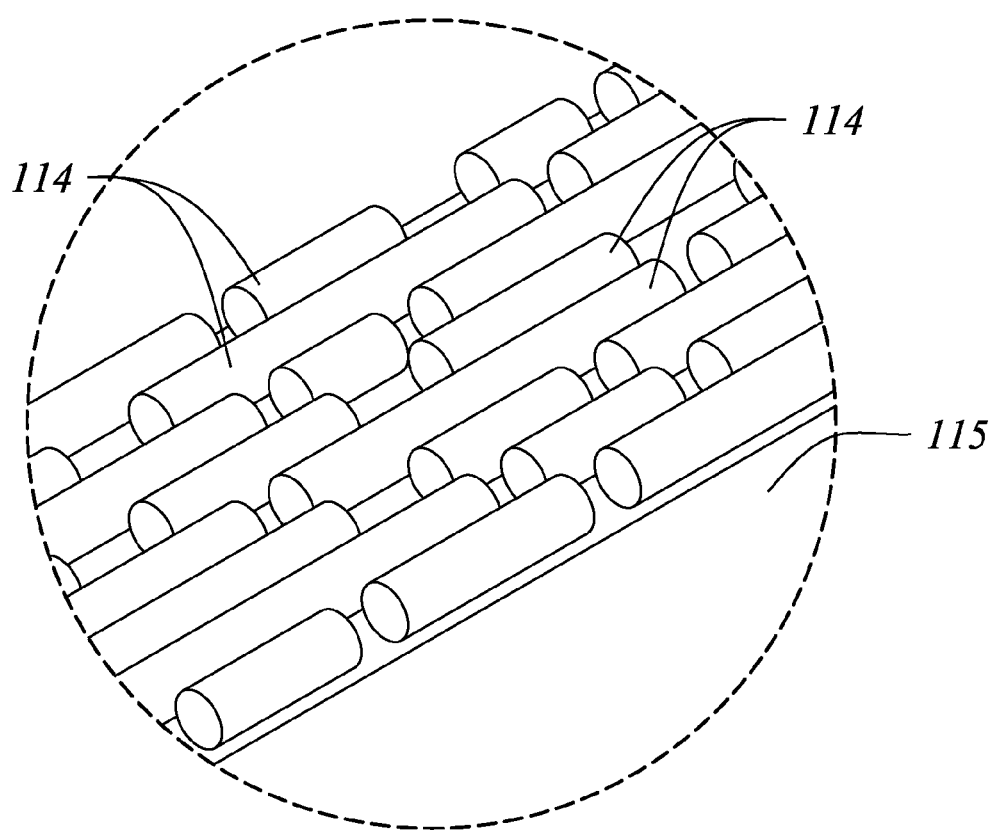
FIG. 2B illustrates an expanded view of a portion of the linear structure illustrated in FIG. 2A.

FIG. 2B illustrates an expanded view of a portion of the linear structure 112 illustrated in FIG. 2A. The nanowires 114 illustrated in FIGS. 2A and 2B are depicted deposited 110 as clustered in or with an oriented distribution. Specifically, an average orientation of the nanowires 114 within the deposited linear structure 112 is in line with or coaxial to a major axis (i.e., dashed line A-A' in FIG. 2A) of the linear structure 112.

Figure 2C:
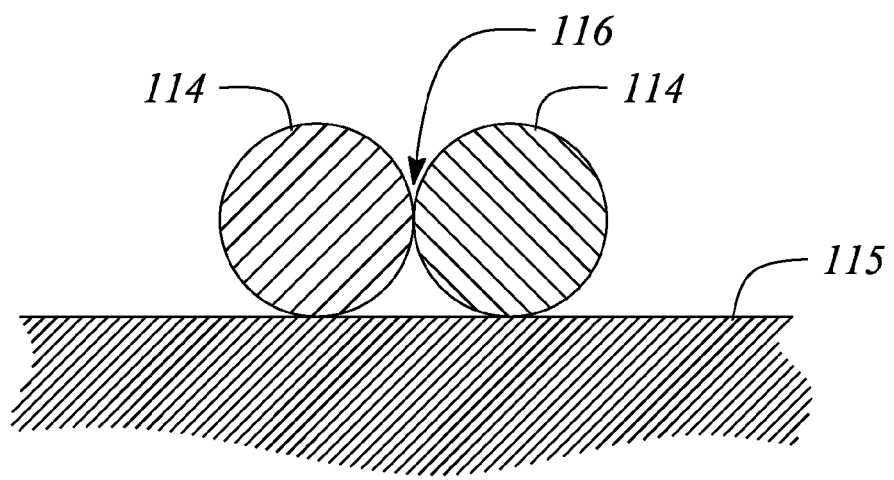
FIG. 2C illustrates a cross section through a first pair of adjacent deposited nanowires according to an embodiment of the present invention.
Figure 2D:
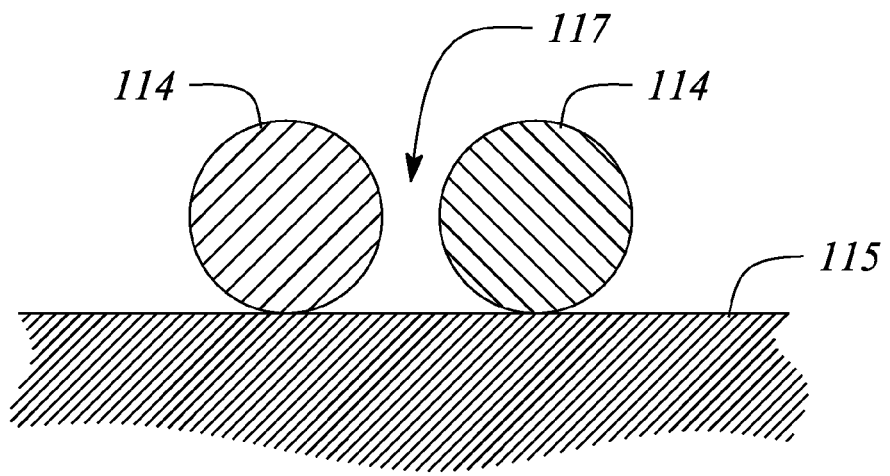
FIG. 2D illustrates a cross section through a second pair of adjacent deposited nanowires according to an embodiment of the present invention.

FIG. 2C illustrates a cross section through a first pair of adjacent deposited nanowires 114 following depositing 110 according to an embodiment of the present invention. The adjacent deposited nanowires 114 illustrated in FIG. 2C contact or touch one another only at a single point 116 on an outer surface of each of the nanowires 114. FIG. 2D illustrates a cross section through a second pair of adjacent deposited nanowires 114 following depositing 110 according to an embodiment of the present invention. As illustrated in FIG. 2D, the adjacent nanowires 114 of the second pair are not in contact with or do not touch one another. Instead, there is a small gap 117 separating the nanowires 114 of the pair. FIGS. 2C and 2D are generally illustrative of the contacts (or lack thereof) and the nature or extent of the contact between the deposited nanowires 114 as a whole within the linear structure 112, and are not intended as a limitation herein. In particular, various embodiments of the present invention apply equally well to end-to-end interconnections of nanowires (i.e., along or associated with a longitudinal axis of the nanowires).

Figure 3:
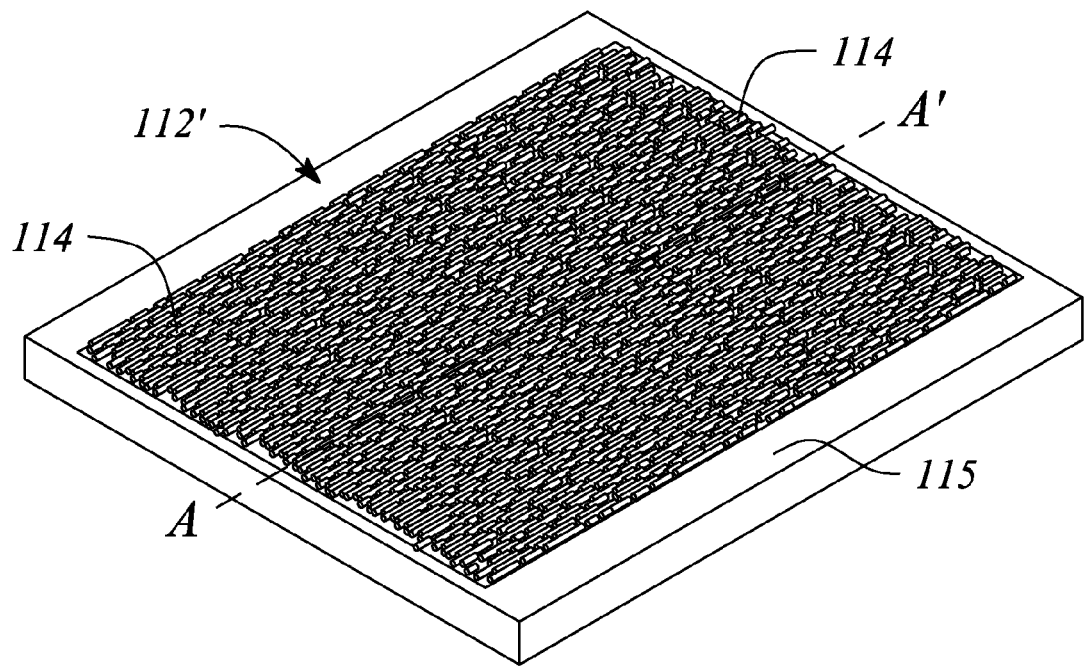
FIG. 3 illustrates a perspective view of a portion of a planar film formed by deposited nanowires according to another embodiment of the present invention.

FIG. 3 illustrates a perspective view of a portion of a planar film 112' formed by deposited nanowires 114 according to another embodiment of the present invention. The nanowires 114 illustrated in FIG. 3 are depicted deposited 110 as clustered in an oriented distribution. While illustrated in FIGS. 2A, 2B, and 3 as oriented nanowires 114 for purposes of discussion herein, the nanowires 114 may be deposited 110 with essentially any orientation including a random orientation. All such distributions are within the scope of the present invention.

Referring again to FIG. 1, the nanowires may be deposited 110 using any of a variety of ways of depositing nanowires on a substrate. In some embodiments, depositing 110 comprises suspending the nanowires in a liquid medium or carrier solution. For example, the nanowires may be mixed in an aqueous solution with or without a surfactant (i.e., a surface active agent) or other additives to assist with suspension and/or distribution of the suspended nanowires. The surfactant serves as a wetting agent and/or an encapsulation agent for the nanowires in the carrier solution. In some embodiments, ionic surfactants are used that have either water soluble or hydrophilic functional groups. Examples of anionic surfactants include, but are not limited to, sodium dodecylsulfate (SDS), sodium deoxycholate (DOC), and N-lauroylsarcosine sodium salt. Examples of cationic surfactants include, but are not limited to, lauryldimethylamine oxide (LDAO), cetyltrimethylammonium bromide (CTAB), and bis(2-ethlyhexyl) sulfosuccinate sodium salt. While included herein as sodium salts, any of the sodium salt surfactants may be a lithium salt or potassium salt, for example, instead of a sodium salt, and is not a limitation herein.

In these embodiments, depositing 110 further comprises applying the carrier solution containing the nanowires to a surface of the substrate. The carrier solution may be applied by any of several means including, but not limited to flooding, spraying, immersion, and flowing. In flooding, the solution carrying the nanowires is applied to the surface as a drop or similar volume to essentially cover the substrate or a portion thereof. With spraying, a volume of the carrier solution with the nanowires is directed at the substrate. For example, the volume directed at the substrate may be in the form of an atomized mist. In another example, the volume may comprise one or more individual droplets carrying the nanowires propelled from a nozzle. The volume directed at the substrate contacts, adheres and eventually coats the substrate or a portion thereof. An inkjet system that employs the carrier solution as 'ink' is an example of spraying the carrier solution using droplets. Immersion involves placing the substrate into a bath of the carrier solution with the nanowires such that the solution surrounds and flows over a surface of the substrate. In flowing, the carrier solution carrying the nanowires is moved across the substrate surface. In some embodiments of flowing, the substrate is immersed in a bath of the carrier solution with the nanowires while the solution flows across the substrate surface.

In some embodiments, capillary forces are employed to assist solution movement during depositing 110. Likewise, one or more of an electric field and a magnetic field, either or both of which may be static (DC) or dynamic (AC), may be employed to assist in depositing 110 the carrier solution. For example, droplets in an atomized mist or from an ink jet system (e.g., spraying) may be electrically charged and then directed or accelerated toward a specific region of the substrate by an electric field. In another example, the nanowires and/or a constituent of the carrier solution may include a magnetic material that is influenced or directed by the presence of a magnetic field. Such embodiments of depositing 110 may be employed to selectively pattern nanowires in designated or targeted locations on the substrate, for example.

In other embodiments, the nanowires are deposited 110 without first being suspended in a carrier solution. For example the nanowires may be sprayed, dusted, or dropped onto the substrate as a powder. In another example, the nanowires are deposited 110 using an electrostatic application method such as is used to apply a toner to a piece of paper in a laserjet printer. Deposition 110 using electrostatic application comprises establishing a charge on the substrate surface and spraying or otherwise directing nanowires having an opposite charge toward the surface. The opposite charge of the nanowires attracts and adheres or fixes the nanowires to the substrate surface. Similarly, depositing 110 prefabricated nanowires on a substrate using essentially any other means of depositing is within the scope of the present invention.

Referring again to FIG. 1, the method 100 of interconnecting nanowires further comprises performing 120 crystal growth. During crystal growth, a crystal lattice of a material is added to a surface of the deposited 110 nanowires. Performing 120 crystal growth includes, but is not limited to, growing single-crystalline, poly-crystalline, and amorphous structures.

In some embodiments, the crystal lattice of the material is the same as (and thus forms an extension or continuation of)

a crystal lattice of the nanowire. In other words, the material crystal lattice comprises a constituent element or elements that is or are the same as (or similar to) that of the nanowire crystal lattice. Moreover, the material crystal lattice is organized or arranged structurally in the same way as the nanowire crystal lattice. As such, the crystal lattice of the nanowire is essentially increased in extent following performing 120 crystal growth, in such embodiments.

In other embodiments, the constituent element of the solute material is different from that of the nanowire. In these other embodiments, the crystal lattice of the different solute material may be arranged or organized in either the same way or a different way as crystal lattice of the nanowire when it is grown on the nanowire surface. In still other embodiments, the crystal lattice of the material is different from the crystal lattice of the nanowire, such that the crystal lattice that grows on the nanowire surface is different.

Crystal growth is performed 120 for a period of time long enough for the newly grown crystal lattice to bridge between adjacent nanowires. A time period for performing 120 crystal growth depends on a variety of factors including, but not limited to, a specific composition of the nanowires, characteristics of the solution providing the added material, and a separation distance between adjacent nanowires. One skilled in the art can readily determine a proper period of time for performing 120 crystal growth for a given situation without undue experimentation. In some embodiments, performing 120 crystal growth comprises one or more growth cycles or events. In some embodiments, performing 120 crystal growth comprises one or more dissolving cycles or events. In some embodiments, the growth cycle and the dissolving cycle may be combined and repeated in various permutations. For example, performing 120 crystal growth may comprise a first growth cycle that is followed by a first dissolving cycle and a second dissolving cycle. Then the second dissolving cycle may be followed by a second growth cycle and a third growth cycle, for example. Moreover, a dissolving cycle may remove more or less crystal material than was deposited during a previous growth cycle.

Figure 4A:
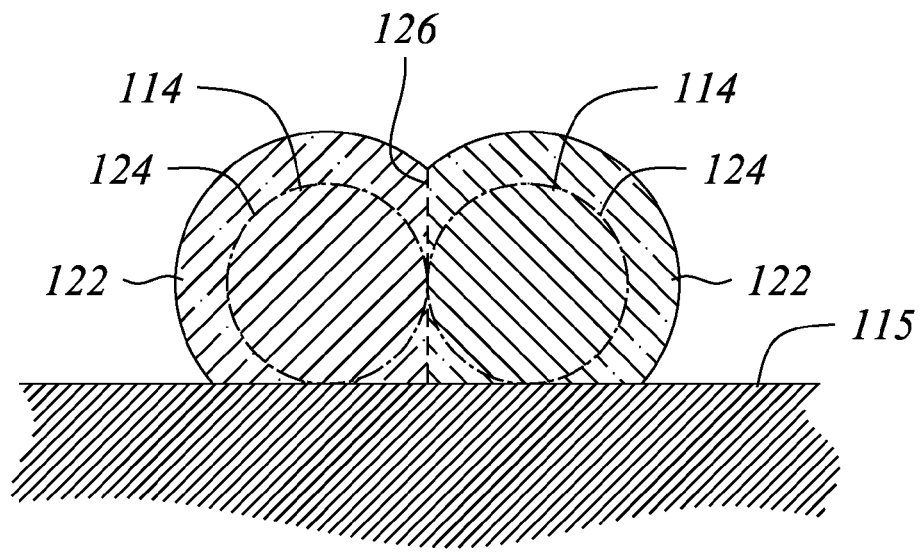
FIG. 4A illustrates in cross section the pair of adjacent nanowires depicted in FIG. 2C after crystal growth according to an embodiment of the present invention.
Figure 4B:
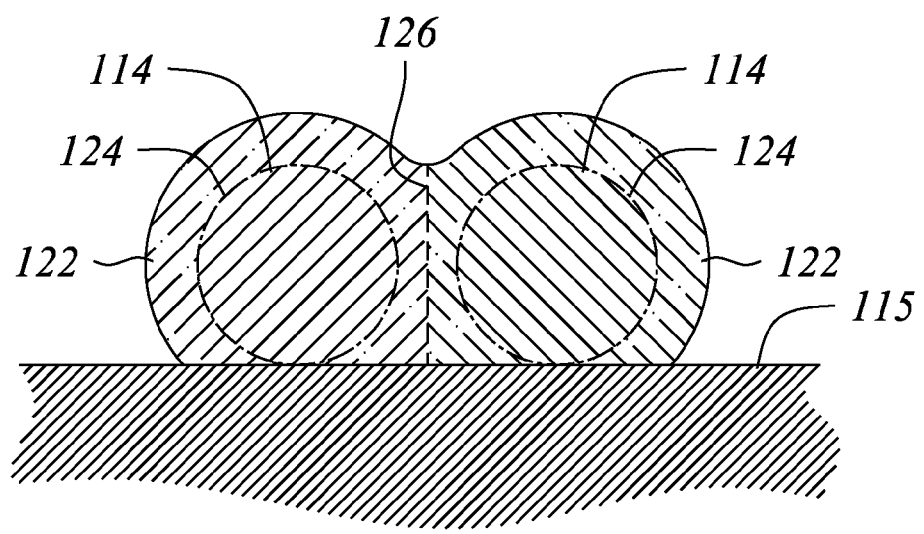
FIG. 4B illustrates in cross section the pair of adjacent nanowires depicted in FIG. 2D after crystal growth according to an embodiment of the present invention.

FIG. 4A illustrates in cross section the pair of adjacent nanowires 114 depicted in FIG. 2C following performing 120 crystal growth according to an embodiment of the present invention. FIG. 4B illustrates in cross section the pair of adjacent nanowires 114 depicted in FIG. 2D following performing 120 crystal growth according to an embodiment of the present invention. As illustrated in FIG. 4A, a newly added crystal lattice 122 has increased an extent of the contact between the adjacent nanowires 114. In effect, performing 120 crystal growth has strengthened or improved the interconnection between the nanowires 114. However, as illustrated in FIG. 4B, the newly added crystal lattice 122 has created a contact between the adjacent nanowires 114 that was not present prior to performing 120 crystal growth (e.g., see FIG. 2D). Therefore, performing 120 crystal growth creates the interconnection between the nanowires 114, in some embodiments. In addition, in some embodiments, performing 120 crystal growth may create, improve and/or strengthen an interconnection between the nanowires 114 and the substrate 115.

In FIGS. 4A and 4B, a boundary 124 between the surface of the nanowires 114 prior to performing 120 crystal growth and the newly grown crystal lattice 122 is illustrated as a 'dash-dot' line 124. In some embodiments, the boundary 124 separates a crystal lattice of the nanowires 114 from that of the newly grown crystal lattice 122. In other embodiments, essentially no actual boundary 124 exists such that the newly grown crystal lattice 122 effectively represents an extension of the crystal lattice of the nanowire 114 on which the lattice 122 is grown. As such, the boundary 124 is illustrated for the purposes of discussion and not by way of limitation herein. A 'dashed' line 126 in FIGS. 4A and 4B illustrates a boundary 126 between the grown crystal lattices 122 on each of the respective adjacent nanowires 114 following performing 120 crystal growth. The boundary 126 is illustrated for discussion purposes only and may or may not be discernable as an actual boundary between the grown crystal lattices 122 on adjacent nanowires 114. The interconnected nanowires 114 illustrated in FIGS. 4A and 4B are representative of cross sectional views of respective portions of interconnected structures according to an embodiment of the present invention.

In some embodiments, performing 120 crystal growth comprises applying a growth solution to the nanowires. When applied, the nanowires are essentially immersed in or surrounded by the growth solution. The growth solution comprises a solvent and a solute. The solute provides the material that is added to the nanowires according to the method 100 of interconnecting. In some embodiments, the solute is a precursor of the crystal lattice of the nanowire, as discussed hereinabove. Therefore, the 'solute' also may be referred to herein as the 'precursor solute' without limitation unless otherwise indicated. The solvent provides a vehicle or medium to carry the solute.

In some embodiments, the growth solution is applied to the nanowires prior to depositing 110 the nanowires on the substrate. For example, the carrier solution used in depositing 110 the nanowires described hereinabove may comprise the growth solution. As such, the growth solution is applied to the nanowires by mixing the nanowires into the growth solution. The nanowires are then deposited 110 onto the substrate along with the applied growth solution, for example using a deposition method described above. In other embodiments, the growth solution is deposited on the substrate. Then the nanowires are deposited 110 onto the substrate through or into the previously deposited growth solution to apply the solution to the nanowires.

In another embodiment, the growth solution is applied to nanowires previously deposited 110 on the substrate. In particular, the nanowires are deposited 110, as described hereinabove, and then the growth solution is deposited on top of or into the deposited nanowires to apply the solution to the nanowires. For example, the nanowires may be suspended in the carrier solution and deposited 110 on the substrate using the inkjet printer method. The carrier solution is evaporated from the substrate, leaving the deposited nanowires affixed to the substrate by one or more of chemical, electrostatic and mechanical adhesion, for example. The growth solution is then applied to the deposited nanowires using one of the bath methods (e.g., immersion, flooding or flowing) or the inkjet deposition technique, described above, for example. In any case, applying the growth solution results in the deposited nanowires being immersed in the growth solution.

Performing 120 crystal growth further comprises changing a saturation condition of the applied growth solution. As discussed above, a characteristic of the solution is adjusted to change the saturation condition of the solution. For example, the saturation condition may be changed from an unsaturated to a supersaturated condition. Alternatively, the saturation condition may be changed from a supersaturated to an unsaturated condition. Changing the saturation condition involves adjusting one or more characteristics of the solution such that a saturation limit of the solution is crossed, as discussed hereinabove. When the saturation limit is crossed, the saturation condition of the solution changes.

In some embodiments, the saturation condition is changed to a supersaturated condition of the precursor solute. Thus, when a solution characteristic is adjusted such that a saturation limit of the solution is crossed, the precursor solute becomes supersaturated. When supersaturated, the precursor solute is able to precipitate from the solution as a crystal or as crystals onto a surface of the deposited nanowire. In other words, the precipitation of the precursor solute facilitates crystal growth on the nanowire. As a result, material is added by crystal growth to the nanowire. In such embodiments, the nanowire essentially acts as a 'seed' for the growing crystal.

In some embodiments, the saturation condition is changed to an unsaturated condition. Thus, when a solution characteristic is adjusted such that a super-critical limit of the solution is crossed, the precursor solute becomes unsaturated. In the unsaturated condition, the solvent of the solution may attack an outer surface of the nanowire, thereby dissolving or etching some of the nanowire crystal lattice. As such, changing the saturation condition to produce an unsaturated state facilitates removal of crystalline material from the surface of the nanowire.

In some of these embodiments, the saturation condition of the solution is changed to be unsaturated one or both of prior to and following a supersaturation condition. In particular, when the saturation condition is changed to an unsaturated condition prior to a supersaturated condition, performing 120 crystal growth essentially 'cleans' an outer portion of the crystal lattice of nanowire before crystal regrowth from the solute takes place. Then the saturation condition is changed from the unsaturated condition to the supersaturated condition. In the supersaturated condition, the solute material regrows a crystal lattice on the 'cleaned' nanowire surface. As such, the crystal being added grows with minimal crystal defects in a vicinity of an interface or boundary between the original lattice of the nanowire and the newly grown lattice that is added by performing 120 crystal growth. The solution may be adjusted to be unsaturated following the crystal growth (i.e., the supersaturation condition) one or more of to similarly clean an outer surface of the newly created lattice, to cease crystal lattice growth and to control an overall extent or amount of the newly created lattice.

In some embodiments, the saturation condition of the solution may be changed multiple times. For example, the saturation condition may be changed from supersaturated to unsaturated and back to supersaturated in sequence a number of times during performing 120 crystal growth. Doing so generally will result in multiple growth events interspersed with multiple cleaning or dissolving events. Moreover, it is within the scope of the embodiments of the present invention that the saturation condition may be changed either prior to deposition 110 or following deposition 110. In particular, depositing 110 the nanowires may be employed either before or after performing 120 crystal growth, depending on the embodiment. Also, in some embodiments, depositing 110 and performing 120 may be employed essentially simultaneously.

As described above, there are many different characteristics of a solution that may be adjusted to change the saturation condition or the solubility of the solute in solution. For example, adjusting a pH of the solution may cross a super-critical limit and produce a change in the saturation condition, as described above.

Figure 5:
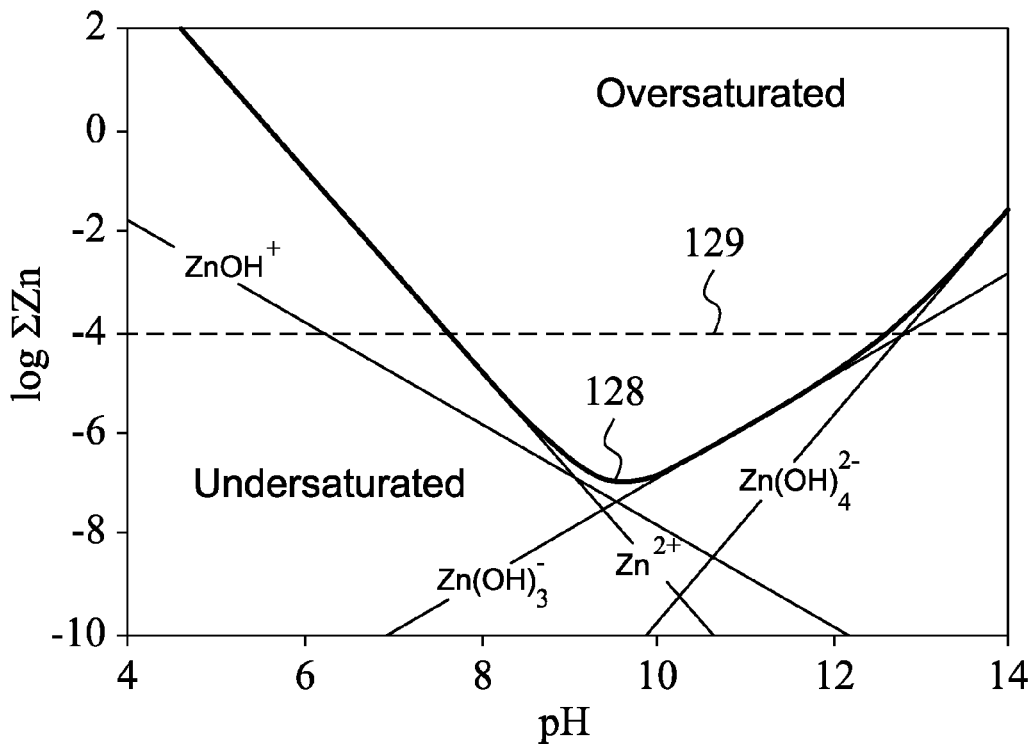
FIG. 5 illustrates an exemplary graph of an effect of pH on a saturation limit of zinc oxide (ZnO) solubility.

FIG. 5 illustrates an exemplary graph of the effect of pH on the super-critical limit of zinc oxide (ZnO) in an aqueous solution. In particular, FIG. 5 illustrates a solubility of ZnO as a function of solution pH and a total concentration of dissolved zinc (Zn). A region of the graph illustrated in FIG. 5 above a curve 128 represents a supersaturated condition while a region below the curve 128 represents an unsaturated condition of the Zn in solution. Thus, for a given concentration of Zn, as illustrated by the 'dashed' line 129 in FIG. 5, changing the pH of the solution from approximately 6 to approximately 10, for example, effectively changes the saturation condition from unsaturated to supersaturated. Similar curves to that illustrated in FIG. 5 exist for other materials. For example, instead of ZnO, Zn may be provided by zinc nitrate ($Zn(NO_3)_2$), zinc acetate ($Zn(C_2H_3O_2)_2$), zinc sulfate ($ZnSO_4$), or zinc chloride ($ZnCl_2$), for example, in aqueous solution. In such embodiments, the zinc source is a typical low decomposition temperature material.

Changing the pH of the solution may be accomplished by adding a pH modifier (e.g., an acid or a base), for example. Examples of pH modifiers for the above-described example include, but are not limited to, bases, such as sodium hydroxide (NaOH), potassium hydroxide (KOH), ammonia ($NH_3$), and methaneamine ($CH_3NH_2$), and acids, such as hydrochloric acid (HCl), sulfuric acid ($H_2SO_4$), acetic acid ($CH_3COOH$). In addition, certain buffers also may be employed as pH modifiers. In general, such a pH modifier may be added before or after deposition 110 to induce crystal growth during performing 120.

In other embodiments, changing the saturation condition may be accomplished by either removing or adding solvent. For example, removing some solvent using evaporation will generally raise a concentration of the solute and facilitate changing from an unsaturated to a supersaturated condition. Likewise, adding solvent in sufficient quantity to a supersaturated solution can result in changing from a supersaturated to an unsaturated condition. In other embodiments, adjusting the saturation may be accomplished by one or more of adding additional solute and changing a temperature of the solution (e.g., cooling a solution raises the saturation level). One skilled in the art is familiar with many other ways of adjusting a saturation condition of a solution, all of which are within the scope of the present invention.

Performing 120 crystal growth further comprises growing a crystal lattice on the nanowire to one or both of create a contact between adjacent deposited nanowires and increase a contact area of the contact between adjacent deposited nanowires. FIGS. 4A and 4B, as described above, illustrate the crystal lattice growth that creates a contact and increases a contact area between adjacent nanowires. As mentioned above, crystal growth is initiated by changing the saturation condition of the applied growth solution from unsaturated to supersaturated. Growth is halted by changing the saturation condition of the applied solution to an unsaturated condition and/or by removing the applied solution from a vicinity of the deposited nanowires. In some embodiments, the crystal growth is reversible as described hereinabove. In some embodiments, interfaces between nanowires after crystal regrowth are characterized by single grain boundaries. Single grain boundaries between interconnected adjacent nanowires may provide lower resistance between adjacent nanowires due to a reduction in lattice defect scattering of electrons when compared to multigrain boundary situations.

Table 1 lists several examples of nanowire and solution combinations that may be employed to interconnect nanowires according to various embodiments of the present invention. In particular, Table 1 lists exemplary nanowire materials, solvents, and solutes. One skilled in the art may readily devise other combinations without undue experimentation. All such combinations are within the scope of the present invention.

TABLE 1

Exemplary nanowire and solution combinations

| Nanowire Material | Solvent | Principle Solute(s) |
|---|---|---|
| ZnO | $H_2O$ | ZnO, $Zn(NO_3)_2$, $ZnSO_4$, $ZnCl_2$, $Zn(C_2H_3O_2)_2$ |
| CdS | $H_2O$ | Cadmium citrate, Cadmium chloride, Thiourea |
| CdSe | $H_2O$ | Cadmium Citrate, N,N-dimethyl-selenourea |
| ZnS | $H_2O$ | $ZnSO_4$, $SC(NH_2)_2$ |
| PbS | $H_2O$ | $Pb(NO_3)_2$, $SC(NH_2)_2$ |

In addition to the nanowire material examples listed in Table 1, other metal-oxides may be substituted for ZnO. For example, any metal-oxide of the form $M_xO_y$, wherein the metal 'M' is selected from zinc (Zn), tin (Sn), indium (In), aluminum (Al), magnesium (Mg), titanium (Ti) chromium (Cr), iron (Fe), cobalt (Co). nickel (Ni), copper (Cu), gallium (Ga), germanium (Ge), molybdenum (Mo), rubidium (Ru), rhodium (Rh), palladium (Pd), cadmium (Cd), antimony (Sb), hafnium (Hf), tantalum (Ta), tungsten (W), rhenium (Re), lead (Pb), and combinations thereof, may be used. These exemplary metals similarly may be substituted for the Zn in the principle solutes in Table 1 for the various metal-oxide nanowire materials. For example, the list of metals 'M' may be substituted for any of the principle solutes having the form $M_x(NO_3)_y$, $M_x(SO_4)_y$, $M_xCl_y$, and $M_x(C_2H_3O_2)_y$. The list of metals provided above is illustrative only and in no way considered a limitation herein. Other metals not listed above may be used and still be within the scope of the embodiments of the present invention. With respect to metal-sulphide nanowire materials, having the form $M_xS_y$, and metal-selenide nanowire materials, having the form $M_xS_y$, any metal M selected from Zn, Cd, Pb, Cu, Ni, Mo Ru, Sb, and their intermixed metal-sulphides or metal-selenides may be substituted for the ZnS, CdS, CdSe, and PbS nanowire material examples listed in Table 1. Moreover, the principle solutes provided in Table 1 for ZnS, CdS, CdSe and PbS nanowire materials may be similarly substituted with a respective metal M from the list above to produce the corresponding metal citrates, metal salts of chlorides, metal sulfates, metal nitrates, and metal ureas, as well as using any of thiourea, urea and $SC(NH_2)_2$. Moreover, it is within the scope of the various embodiments that other metal compounds and metal-like (e.g., semiconductor) compounds not listed above may be employed, as well as other solute materials.

In addition to the solvent examples listed in Table 1, a solvent other than water ($H_2O$) may be used in any of the examples listed in Table 1, as well as the other examples above, and includes, but is not limited to, solid-state electrolytes, ethanol, acetone, isopropranol, ethyl acetate, and various polymeric solvents. Ranges of solute concentrations are dependent on specific material combinations and solvents employed. However, generic concentration ranges of approximately 1 µM to 5 M generally apply. For example, when ZnO in $H_2O$ is used, concentrations from 25 µM to 3-4 M have been successfully employed for interconnecting 100 ZnO nanowires.

Figure 6:
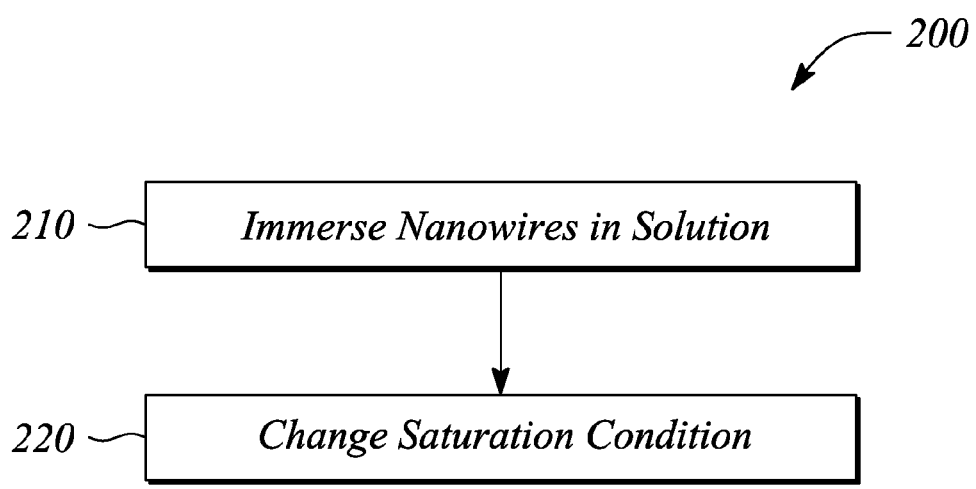
FIG. 6 illustrates a flow chart of a method of modifying a size of a preformed nanowire using crystal growth according to an embodiment of the present invention.

FIG. 6 illustrates a flow chart of a method 200 of modifying a size or dimension of a preformed nanowire using crystal growth according to an embodiment of the present invention. In some embodiments, the method 200 primarily modifies a diameter of the nanowire. In such embodiments, the diameter may be increased to facilitate a mechanical and/or electrical connection with an adjacent nanowire. In other embodiments, the method 200 modifies one or both of a diameter and a length of the nanowire. In such embodiments, either or both of the length and the diameter may be increased to facilitate a mechanical connection and/or an electrical connection with one or more adjacent nanowires.

The method 200 of modifying the nanowire size comprises immersing 210 one or more preformed nanowires in a solution containing a nanowire crystal precursor material as a solute. For example, ZnO nanowires may be immersed in a solution containing the precursor material ZnO in an aqueous solution, where dissolved $Zn^{2+}$ ion and various other solute species of dissolved Zn are produced from the dissolved Zn salts. In another example, CdS nanowires may be immersed in a solution containing the precursor materials cadmium chloride and thiourea in aqueous solution, where dissolved $Cd^{2+}$ ions, $S^{2-}$ ions and various other solute species of dissolved Cd and S are produced by the dissolved cadmium chloride and thiourea. Other specific examples of nanowire and solution combinations are listed in Table 1 and other examples are provided in the two paragraphs that follow Table 1. One skilled in the art may readily devise a number of other nanowire and solution combinations that could be used in the method 200 described hereinbelow.

The method 200 further comprises changing 220 a saturation condition of the solute in solution. In some embodiments, the saturation condition of the solute is changed to an unsaturated condition. When changed to the unsaturated condition, a solvent of the solution may attack and effectively dissolve material from a surface of the immersed nanowire. In such embodiments, the method 200 of modifying a size is essentially a method of reducing a size of the nanowire. In other embodiments, the saturation condition of the solute is changed to a supersaturated condition. In such embodiments, the solute may precipitate from the solution and add to a crystal lattice of the nanowire. As such, the method 200 of modifying a size is essentially a method of increasing a size of the nanowire.

As mentioned above, the size dimension affected is predominantly the diameter of the nanowire for some of the embodiments of the present invention. However, other size dimensions such as length of the nanowire also may be affected in addition to or in lieu of the diameter, all of which are within the scope of the various embodiments described herein.

In yet other embodiments, changing 220 a saturation condition both dissolves material from a surface of the nanowire under a first saturation condition and initiates crystal growth on a surface of the nanowire under a second saturation condition. In these embodiments, the solute saturation condition is selectively changed 220 from either an equilibrium condition (i.e., at a saturation limit) or the second saturation condition (i.e., supersaturated or above a saturation limit) to the first or unsaturated condition to dissolve crystal material from the nanowire. Moreover, the solute saturation condition is selectively changed 220 from either the equilibrium condition or the first saturation condition (i.e., unsaturated) to the second or supersaturated condition to grow crystals on the surface of the nanowire.

Changing 220 the saturation condition comprises adjusting a parameter of the solution such that a super-critical limit of the solution is crossed or exceeded to either grow or dissolve crystal material. In some embodiments, a temperature of the solution is the adjusted parameter. For example, the solution may be cooled to cross a temperature super-critical limit separating an unsaturated condition of the solution from a supersaturated condition. In another embodiment, a pH of the solution may be changed to cross a pH super-critical limit. For example, referring to FIG. 5, a pH of a ZnO solution in which ZnO nanowires are immersed may be adjusted, thereby crossing the pH super-critical limit 128, as indicated by the dashed line 129. As mentioned above, a pH modifier may be added to the solution, for example, to change 220 the pH of the solution and cross the pH super-critical limit to effect a change in the saturation condition. Moreover, the concentration of the solute may be manipulated to change 220 the saturation condition. In still other embodiments, a combination of one or more of pH, temperature and concentration may be used to effect the change 220.

Figure 7:
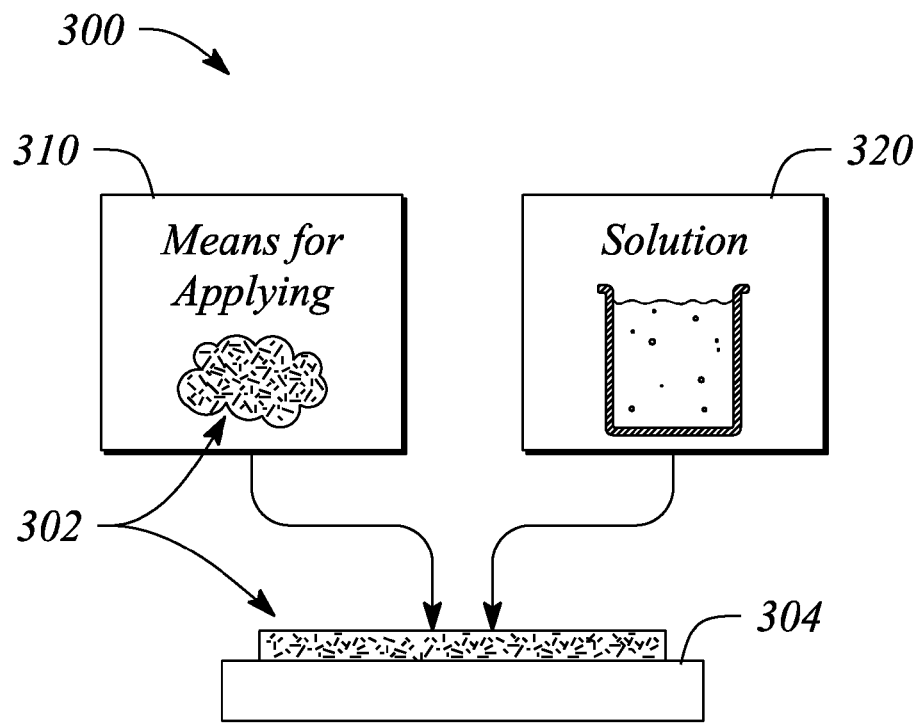
FIG. 7 illustrates a block diagram of a nanowire interconnecting system according to an embodiment of the present invention.

FIG. 7 illustrates a block diagram of a nanowire interconnection system 300 according to an embodiment of the present invention. The nanowire interconnecting system 300 fuses together adjacent nanowires 302 deposited on a substrate. The nanowires 302 are fused together by a material added to surfaces of the nanowires 302, as is described hereinabove with respect to the method 100. The nanowire interconnecting system 300 not only produces new interconnections between previously disconnected adjacent nanowires 302, but also strengthens or improves pre-existing connections between adjacent nanowires, according to various embodiments of the present invention. In addition, the nanowire interconnection system 300 modifies a size of the nanowires 302, as is described hereinabove with respect to the method 200. As such, the nanowire interconnecting system 300 may also be considered a nanowire size-modifying system. In some embodiments, the added material is produced by growing a new crystal lattice on an existing crystal lattice of the nanowire 302. In some embodiments, new crystal lattice is grown using multiple cycles of crystal growth and/or crystal regrowth.

The system 300 comprises means for applying 310 nanowires 302 onto a surface of a substrate 304. The means for applying 310 deposits prefabricated nanowires 302. The deposited nanowires 302 may have one or both of an oriented and an unoriented distribution on the substrate 304 surface. The means for applying 310 deposits the nanowires 302 in one or both of a linear, wire-like structure and a planar film that coats the substrate 304 surface or a portion thereof, for example as described above with reference to FIGS. 2A and 3.

In some embodiments, the means for applying 310 deposits the nanowires 302 while suspended in a solvent or carrier solution. For example, the means for applying 310 may suspend the nanowires in an aqueous or nonaqueous solution with or without a surfactant or other additives to assist with suspension and/or distribution of the suspended nanowires 302. The suspended nanowires 302 are then deposited by the means for applying 310 by one or more of flooding, spraying, immersion, or flowing the suspended nanowires onto the substrate surface 304. Examples of the means for applying 310 using solvent suspension of the nanowires include, but are not limited to, an eye dropper or pipette, an ink jet printer, a substrate bath or flow cell, and an aerosol sprayer (e.g., paint sprayer).

In other embodiments, the means for applying 310 deposits the nanowires 302 without first suspending the nanowires in a carrier solution. In such embodiments, the means for applying 310 may one or more of spray, dust, or drop the nanowires in a power-like form onto the substrate 304. In some embodiments, the means for applying 310 may employ a means for directing or propelling the nanowires 302 toward the substrate 304. In some embodiments, the means for applying 310 may employ electric and/or magnetic forces to propel and/or direct the nanowires during deposition. For example, the nanowires 302 may be given an electric charge. An electric field applied to the charged nanowires 302 is then used to one or both of propel and direct the nanowires 302 toward the substrate 304.

In some embodiments, the means for applying 310 may further or alternatively employ a means for adhering the deposited nanowires 302 to the substrate 304 surface. For example, the means for applying 310 may employ electric and/or magnetic forces at or near the substrate 304 to adhere the nanowires 302 to the substrate 304 surface. An example of using electric forces to both propel and adhere the nanowires 302 is an electrostatic toner application system, such as is used to apply a toner to a piece of paper in a laserjet printer. In particular, when a laserjet printer is used as the means for applying 310, the paper of the laserjet printer is replaced by the substrate 304 and the toner is replaced by the nanowires 302.

The system 300 further comprises a solution 320 with a controllable saturation condition. The solution 320 comprises a solvent and a solute in which the nanowires 302 are immersed during an operation of the system 300. In some embodiments, the solute is a precursor of a crystal lattice material of the nanowires 302. In particular, under the controlled saturation condition of the solution 320, one or both of the solute will precipitate from the solution 320 and add to a crystal lattice of the immersed nanowires 302 and the solvent will dissolve a portion of the crystal lattice of the immersed nanowires 302, depending on the embodiment. For example, when the solution 320 is supersaturated with the solute, a new crystal lattice will grow on the immersed nanowires 302. When the saturation condition of the solution 320 is unsaturated, the solvent may attack and dissolve portions of the nanowire crystal lattice of the immersed nanowires 302. When both conditions are sequentially applied to the nanowires, a surface of the nanowires is etched and then crystal material is added to or grown on the etched surface. As such, crystal grain boundaries between the nanowire crystal lattice and that of the grown crystal are reduced and may be minimized.

The solvent and the solute of the solution 320 may be any solvent/solute system applicable to adding new crystal lattice to and/or dissolving crystal lattice from the nanowires provided that the saturation condition of the solution is controllable. For example, when dealing with Zn or ZnO nanowires, the solution may comprise water ($H_2O$) as the solvent and ZnO as the solute. Table 1 hereinabove and the two paragraphs that immediately follow Table 1 list several additional examples of the solution 320 and nanowire materials.

In some embodiments, the nanowires 302 are immersed in the solution 320 after deposition by the means for applying 310. In other embodiments, the nanowires 302 are immersed in the solution 320 prior to deposition by the means for applying 310. In yet other embodiments, the nanowires 302 are immersed in the solution 320 during deposition by the means for applying 310 (e.g., the nanowires are deposited into a previously deposited solution 320 on the substrate).

The saturation condition of the solution 320 may be controlled in a number of ways depending on the embodiment, as described above for the method 100 or the method 200. As a result, the nanowire interconnection system 300 provides for the interconnection of adjacent nanowires on a substrate to form a structure, such as a film or trace.

Figure 8A:
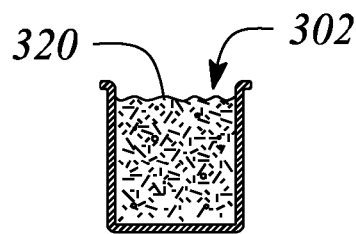
FIG. 8A illustrates a diagram of prefabricated nanowires suspended in an exemplary solution according to an embodiment of the present invention.
Figure 8A:

FIGS. 8A-8D illustrate an operation of an exemplary ink-jet-based nanowire interconnection system 300 that is illustrated generally in FIG. 7. FIG. 8A illustrates suspending prefabricated nanowires 302 in an exemplary solution 320, according to an embodiment of the present invention. The exemplary solution 320 initially may be in either an unsaturated condition or an equilibrium state. A surfactant may be employed to assist in suspending the nanowires 302 in the solution 320.

Figure 8B:
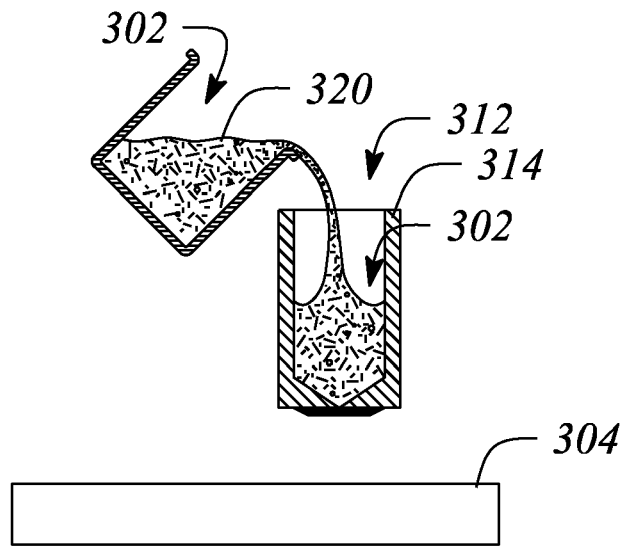
FIG. 8B illustrates a diagram of transferring the suspended nanowires of FIG. 8A into an ink reservoir of a print head of an inkjet printer according to an embodiment of the present invention.

FIG. 8B illustrates placing the suspended nanowires 302 of FIG. 8A in an ink reservoir 312 of a print head 314 of an inkjet printer (not illustrated) according to an embodiment of the present invention. As such, the solution containing the suspended nanowires 302 is essentially an inkjet printer ink and the formulation of the solution is an ink formulation. As illustrated in FIG. 8B, the print head 314 and the inkjet printer are serving as the means for applying 310 for the exemplary inkjet-based nanowire interconnection system 300.

Figure 8C:
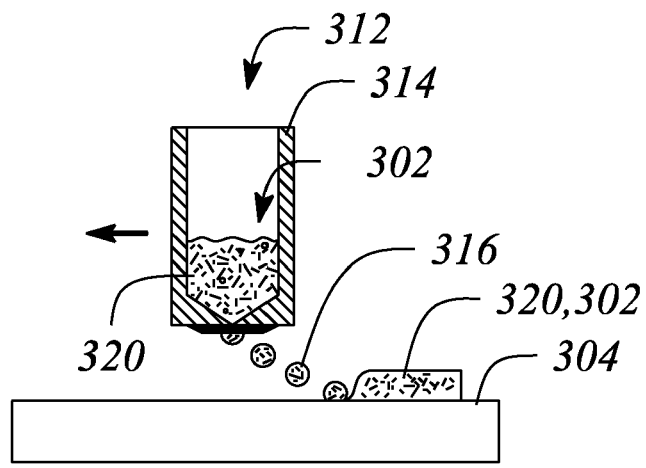
FIG. 8C illustrates a diagram of depositing the suspended nanowires onto a substrate using the inkjet printer print head of FIG. 8B according to an embodiment of the present invention.

FIG. 8C illustrates depositing the nanowires 302 onto a substrate 304 using the inkjet printer print head 314, according to an embodiment of the present invention. In particular, drops 316 containing the solution 320 with the suspended nanowires 302 are ejected from the print head 314 toward the substrate 304. The drops 316 of the solution 320 impact and stick to a surface of the substrate 304.

Figure 8D:
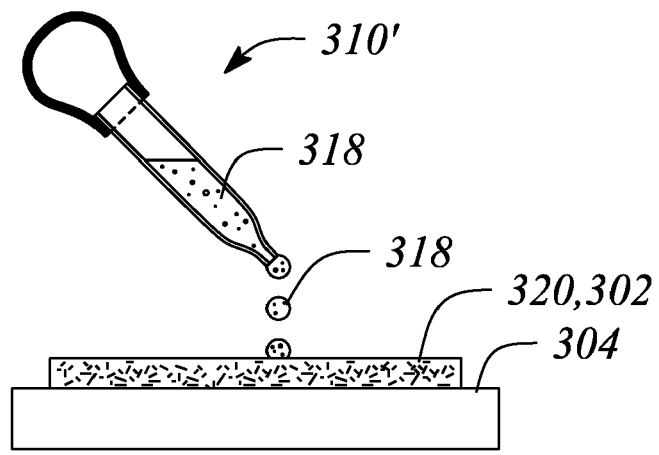
FIG. 8D illustrates a diagram of adding a pH modifier to the deposited nanowires of FIG. 8C according to an embodiment of the present invention.

FIG. 8D illustrates adding a pH modifier solution 318 to the deposited nanowire-containing solution 320 according to an embodiment of the present invention. Another means for applying 310, which may be an inkjet print head 314 or an eye dropper (as illustrated in FIG. 8D), for example, is employed to add the pH modifier solution 318 to the previously deposited nanowire-containing solution 320. The pH modifier solution 318 changes or adjusts a pH of the solution 320 such that the saturation condition changes from an existing condition to a different saturation condition, such as a supersaturated condition, for example. In the supersaturated condition, the solution is supersaturated in solute, which facilitates growth of a new crystal lattice on the nanowires 302 in the solution 320. As the new crystal lattice grows on the nanowires 302, adjacent nanowires 302 eventually form interconnections with one another.

After the nanowires 302 are sufficiently interconnected, the solution 320 is removed (e.g., washed off the substrate) leaving the interconnected nanowires 302. In some embodiments, removal of the solution 320 includes changing the pH, temperature or another solution characteristic to cease crystal growth before washing the solution 320 from the substrate. The interconnected nanowires form an essentially continuous interconnected structure having improved electrical, mechanical and/or optical properties, for example, compared to the same nanowires before crystal growth and interconnection.

In some embodiments, the interconnected nanowires 302 may be further processed following removal of the solution 320. For example, the interconnected nanowires 302 may be thermally annealed following solution removal. In such embodiments the system 300 further comprises further comprising post processing equipment that facilitates one or more of thermal annealing, laser annealing, photo-annealing and ion bombardment of the deposited nanowires or the fused nanowires.

In other embodiments of the present invention, an interconnected structure is provided. The interconnected structure comprises a plurality of individual nano-structures disposed on a surface of a substrate. The individual nano-structures are physically interconnected to one another. The interconnections between the nano-structures comprise crystal lattices grown on a surface of the nano-structures to bridge between adjacent ones of the nano-structures to form a continuous interconnected structure. The grown crystal interconnections form at or comprise intersections between the grown crystal lattices.

The crystal lattices are grown from a growth solution to which the individual nano-structures are exposed. The growth solution comprises a solvent and a crystal growth precursor solute. The growth solution has a controllable saturation condition. The controllable saturation condition facilitates epitaxial crystal growth when the saturation condition is controlled to be supersaturated. In some embodiments, the saturation condition of the growth solution is controlled by controlling one or more of a pH, a solute concentration, and a temperature of the solution. In some embodiments, the interconnected structures are fabricated using either the method 100 or the method 200, as described above. In some embodiments, the interconnected structures are fabricated using the interconnection system 300 described above.

In some embodiments, the interconnected structure is a linear or wire-like structure or trace on the substrate that has a length-dominated aspect ratio. The interconnected trace includes a portion along its length that is one or more of straight, branched and curved, for example, Moreover, a portion of the interconnected trace may have one or both of a constant width and a variable width.

In other embodiments, the interconnected structure is a planar film on the substrate that may cover all or a portion of the substrate surface. The interconnected film may be used as a dielectric layer or a conductive layer (e.g., ground plane), for example, in a single layer nano-scale device or a multi-layer nano-scale device. Moreover, the interconnected film may be used as a starting layer that may be processed into a variety of shapes, such as the wire-like structure or trace, for example.

The individual nano-structures within the interconnected structure are one or both of nanowires and nanoparticles, for example. The individual nano-structures are arranged or distributed in the interconnected structure with one of a generally oriented distribution or an essentially unoriented (e.g., random) distribution. The interconnections between the individual nano-structures may be epitaxial-grown crystal lattices that are either the same as or different from the crystal lattice of the nano-structure being interconnected. In some embodiments, where grain boundaries exist between the interface of the grown crystal lattice and the nano-structures crystal lattice, the grain boundaries are reduced to reduce interfacial defects in the overall interconnected structure. FIGS. 4A and 4B illustrate cross sectional views of pairs of nanowires that represent portions of either a linear interconnected structure or a film interconnected structure.

In some embodiments, the individual nano-structures comprise complementary single crystal lattices of essentially similar material. In some embodiments, the grown crystal lattice comprises essentially the same material and lattice structure as that of the individual nano-structures. In other embodiments, the grown crystal lattice comprises either a different material or a different lattice structure than that of the individual nano-structures.

In another embodiment of the present invention, an ink formulation for an inkjet printer is provided. The ink formulation comprises a plurality of nanostructures suspended in a crystal growth solution. The crystal growth solution comprises a solute of a crystal precursor material dissolved in a solvent. The crystal growth solution has a controllable saturation condition such that when the saturation condition is controlled or adjusted to cross a super-critical limit of the solute, a crystal material is either added to or removed from the plurality of nano-structures in the solution.

For example, when the saturation condition is adjusted to be supersaturated, the crystal precursor material grows a crystal lattice on the suspended nano-structures. As such, the suspended nano-structures grow in size and adjacent ones of the nano-structures become interconnected by the crystal lattice growth. Such crystal growth is typically reserved for after the ink formulation is deposited on a substrate with the inkjet printer, for example.

The grown crystal lattice facilitates fusing of the plurality of nano-structures on the substrate to fix or solidify the ink in a deposited pattern. In some embodiments, the ink formulation comprises a crystal precursor material that grows a crystal lattice on the plurality of nano-structures that is essentially the same as a crystal lattice of the nano-structures. In other embodiments, the ink formulation comprises a crystal precursor material that grows a crystal lattice on the plurality of nano-structures that is different from the crystal lattice of the nano-structures. In some embodiments, the ink formulation comprises a crystal precursor material that is essentially the same as a material of the nano-structures. In other embodiments, the ink formulation comprises a crystal precursor material that is different from the material of the nano-structures.

In some embodiments, the plurality of nano-structures in the ink formulation comprises nanowires. In some embodiments, the plurality of nano-structures in the ink formulation comprises nanoparticles. In other embodiments, the plurality of nano-structures in the ink formulation comprises both nanowires and nanoparticles. Moreover, the plurality of nano-structures in the ink formulation may be made of the same material or at least one nano-structure of the plurality may be made of a material different from other nano-structures in the plurality, depending on the embodiment.

Thus, there have been described embodiments of a method and a system of nanostructure interconnection that employ a controllable saturation condition of a solution to grow new crystal lattice on nanostructures such that adjacent nanostructures are interconnected. Further, various embodiments of an interconnected structure and of an ink formulation that comprise nano-structures have been described. It should be understood that the above-described embodiments are merely illustrative of some of the many specific embodiments that represent the principles of the present invention. Clearly, those skilled in the art can readily devise numerous other arrangements without departing from the scope of the present invention as defined by the following claims.

What is claimed is:

1. A method of interconnecting nano-structures comprising:
    performing crystal growth on prefabricated nano-structures immersed in a growth solution having a controllable saturation condition, such that interconnection between the nano-structures is facilitated.

2. The method of interconnecting of claim 1, wherein performing crystal growth increases a size of the nano-structures by adding material to a surface of the nano-structures.

3. The method of interconnecting of claim 1, wherein performing crystal growth one or both of increases a contact area between adjacent nano-structures and closes up spaces between adjacent nano-structures.

4. The method of interconnecting of claim 1, wherein performing crystal growth grows material epitaxially on each nano-structure to fuse together adjacent nano-structures.

5. The method of interconnecting of claim 1, further comprising depositing the nano-structures on a surface of a substrate prior to performing crystal growth on the prefabricated nano-structures.

6. The method of interconnecting of claim 5, wherein the nano-structures are deposited in clusters on the substrate surface to approximate one or both of a wire-like structure and a planar film.

7. The method of interconnecting of claim 5, wherein the deposited nano-structures have either an oriented distribution or an essentially random distribution on the substrate surface.

8. The method of interconnecting of claim 1, further comprising depositing the nano-structures on a substrate prior to the nano-structures being immersed in the growth solution.

9. The method of interconnecting of claim 1, wherein performing crystal growth comprises:
    immersing the nano-structures in the growth solution, the solution comprising a crystal precursor solute dissolved in a solvent;
    changing the controllable saturation condition of the growth solution, such that the solution is supersaturated with the crystal precursor solute; and
    growing a crystal lattice on a surface of the nano-structures from the supersaturated solution, such that a size or dimension of the nano-structures is increased.

10. The method of interconnecting of claim 9, further comprising depositing the immersed nano-structures on a substrate surface prior to changing the saturation condition.

11. The method of interconnecting of claim 9, further comprising depositing the nano-structures on a substrate surface prior to immersing the nano-structures in the growth solution.

12. The method of interconnecting of claim 9, wherein the crystal precursor solute comprises a precursor material that grows the crystal lattice on the nano-structure surface.

13. The method of interconnecting of claim 12, wherein one or both of the precursor material is in common with a material of the nano-structures and the crystal lattice grown from the precursor material is in common with the crystal lattice of the nano-structures.

14. The method of interconnecting of claim 9, wherein changing the controllable saturation condition comprises changing one or more of a pH of the solution, a temperature of the solution and a concentration of the solute in the solution to cross a solubility boundary of the solute in the solution.

15. The method of interconnecting of claim 10, wherein changing the controllable saturation condition comprises adding a saturation modifying material to the growth solution to induce the saturation condition change.

16. The method of interconnecting of claim 1, wherein performing crystal growth comprises reversible crystal growth.

17. The method of interconnecting of claim 1, wherein performing crystal growth comprises one or both of a growth cycle and a dissolving cycle, wherein the cycles are optionally repeated.

18. The method of interconnecting of claim 1, wherein the nano-structures comprise nanowires.

19. A method of modifying a size of a preformed nano-structure using crystal growth comprising:
    immersing preformed nano-structures in a solution comprising a solute of a nano-structure precursor material; and
    changing a saturation condition of the solution to one or both of etch material from a surface of the preformed nano-structure and initiate crystal growth on the surface of the preformed nano-structure, such that the size of the preformed nano-structure is modified.

20. The method of modifying of claim 19, further comprising:
    depositing the preformed nano-structures on a surface of a substrate prior to immersing.

21. The method of modifying of claim 19, further comprising:
depositing the immersed preformed nano-structures on a surface of a substrate prior to changing a saturation condition.

22. The method of modifying of claim 19, further comprising:
depositing the preformed nano-structures on a surface of a substrate prior to immersing and prior to changing a saturation condition.

23. The method of modifying of claim 22, wherein when crystal growth is initiated, a perimeter of the deposited nano-structures is increased, such that a physical connection between adjacent nano-structures is facilitated.

24. The method of modifying of claim 22, wherein the saturation condition is changed to first etch material from the deposited nano-structure surface and then to initiate crystal growth on the etched surface of the deposited nano-structure.

25. The method of modifying of claim 22, wherein when the saturation condition is changed to initiate crystal growth, one or both of a physical contact between adjacent deposited nano-structures is created and a contact area between adjacent deposited nano-structures is increased.

26. The method of modifying of claim 19, wherein the preformed nano-structures comprise nanowires.

27. A method of interconnecting nanowires comprising:
performing crystal growth on prefabricated nanowires immersed in a growth solution having a controllable saturation condition, such that interconnection between the nanowires is facilitated.

28. The method of interconnecting of claim 27, further comprising depositing the nanowires on a surface of a substrate prior to performing crystal growth on the prefabricated nanowires.

29. The method of interconnecting of claim 27, further comprising depositing the nanowires on a substrate prior to the nanowires being immersed in the growth solution.

30. The method of interconnecting of claim 27, wherein performing crystal growth comprises:
immersing the nanowires in the growth solution, the solution comprising a crystal precursor solute dissolved in a solvent;
changing the controllable saturation condition of the growth solution, such that the solution is supersaturated with the crystal precursor solute; and
growing a crystal lattice on a surface of the nanowires from the supersaturated solution, such that adjacent nanowires fuse together.

31. The method of interconnecting of claim 30, further comprising depositing the immersed nanowires on a substrate surface prior to changing the saturation condition.

32. The method of interconnecting of claim 27, wherein the deposited nanowires have either an oriented distribution or an essentially random distribution on the substrate surface, and wherein the nanowires are deposited in clusters on the substrate surface to approximate one or both of a wire-like structure and a planar film.

33. A method of modifying a size of a preformed nanowire using crystal growth comprising:
immersing preformed nanowires in a solution comprising a solute of a nanowire precursor material; and
changing a saturation condition of the solution to one or both of etch material from a surface of the preformed nanowire and initiate crystal growth on the surface of the preformed nanowire, such that the size of the preformed nanowire is modified.

34. The method of modifying of claim 33, further comprising:
depositing the preformed nanowires on a surface of a substrate either prior to or after immersing, wherein the nanowires are deposited prior to changing a saturation condition.

35. The method of modifying of claim 33, wherein when crystal growth is initiated, a diameter size of the deposited nanowires is increased, such that a physical connection between adjacent nanowires is facilitated.

36. The method of interconnecting of claim 1, further comprising:
etching material from a surface of the immersed prefabricated nano-structures prior to performing crystal growth, wherein both etching material and performing crystal growth comprise changing the controllable saturation condition of the growth solution, such that a size of the prefabricated nano-structures is modified during interconnection.

37. The method of modifying a size of claim 19, wherein changing a saturation condition further facilitates an interconnection between adjacent preformed nano-structures during crystal growth.

38. The method of interconnecting of claim 27, further comprising:
etching material from a surface of the immersed prefabricated nanowires prior to performing crystal growth, wherein both etching material and performing crystal growth comprise changing the controllable saturation condition of the growth solution, such that a size of the prefabricated nanowires is modified during interconnection.

39. The method of modifying a size of claim 33, wherein changing a saturation condition further facilitates an interconnection between adjacent preformed nano-structures during crystal growth.

40. A method of modifying nano-structures comprising:
changing a saturation condition of a solution that comprises prefabricated nano-structures and a solute of a nano-structure precursor material to control one or both of modifying a size of the prefabricated nano-structures and facilitating an interconnection between the nano-structures.

41. The method of modifying nano-structures of claim 40, wherein the size of the prefabricated nano-structures is modified comprising changing the saturation condition of the solution to one or both etch material from a surface of the prefabricated nano-structures and initiate crystal growth on the surface of the prefabricated nano-structures.

42. The method of modifying nano-structures of claim 41, wherein either initiating crystal growth on the surface of the prefabricated nano-structures or both etching material from a surface of the prefabricated nano-structures and initiating crystal growth on the surface of the prefabricated nano-structures further facilitate an interconnection between the nano-structures.

43. The method of modifying nano-structures of claim 40, wherein the interconnection between the nano-structures is facilitated comprising changing the saturation condition of the solution to either initiate crystal growth on the surface of the prefabricated nano-structures or both etch material from a surface of the prefabricated nano-structures and initiate crystal growth on the etched surface of the prefabricated nano-structures.

44. The method of modifying nano-structures of claim 40, wherein the interconnection between nano-structures is facilitated by modifying a size of the prefabricated nano-structures with the changed saturation condition, such that the size is ultimately increased until adjacent nano-structures make physical contact.

45. A method of interconnecting nano-structures comprising:

performing crystal growth on prefabricated nano-structures immersed in a growth solution having a controllable saturation condition, such that interconnection between the nano-structures is facilitated, wherein performing crystal growth comprises changing the controllable saturation condition of the growth solution to favor crystal growth.

46. A method of interconnecting nanowires comprising:

performing crystal growth on prefabricated nanowires immersed in a growth solution having a controllable saturation condition, such that interconnection between the nanowires is facilitated, wherein performing crystal growth comprises changing the controllable saturation condition of the growth solution to favor crystal growth.

* * * * *

UNITED STATES PATENT AND TRADEMARK OFFICE
CERTIFICATE OF CORRECTION

PATENT NO. : 7,482,253 B2  Page 1 of 1
APPLICATION NO. : 11/689487
DATED : January 27, 2009
INVENTOR(S) : Alfred Pan et al.

It is certified that error appears in the above-identified patent and that said Letters Patent is hereby corrected as shown below:

In column 1, line 9, delete "if" and insert -- of --, therefor.

In column 13, line 38, delete "$M_xS_y$," and insert -- $M_xSe_y$, --, therefor.

Signed and Sealed this

Fourteenth Day of July, 2009

JOHN DOLL
*Acting Director of the United States Patent and Trademark Office*